(12) United States Patent
Hattori et al.

(10) Patent No.: US 10,669,630 B2
(45) Date of Patent: Jun. 2, 2020

(54) LAYER-FORMING DEVICE AND INJECTOR

(71) Applicant: Mitsui Engineering & Shipbuilding Co., Ltd., Chuo-ku, Tokyo (JP)

(72) Inventors: Nozomu Hattori, Tamano (JP);
Naomasa Miyatake, Tamano (JP);
Yasunari Mori, Tamano (JP)

(73) Assignee: MITSUI E&S MACHINERY CO., LTD., Tokyo (JP)

( * ) Notice: Subject to any disclaimer, the term of this patent is extended or adjusted under 35 U.S.C. 154(b) by 1011 days.

(21) Appl. No.: 14/770,793

(22) PCT Filed: Feb. 21, 2014

(86) PCT No.: PCT/JP2014/054177
§ 371 (c)(1),
(2) Date: Aug. 26, 2015

(87) PCT Pub. No.: WO2014/132892
PCT Pub. Date: Sep. 4, 2014

(65) Prior Publication Data
US 2016/0010209 A1   Jan. 14, 2016

(30) Foreign Application Priority Data

Feb. 28, 2013 (JP) ................................. 2013-039728

(51) Int. Cl.
*C23C 16/44* (2006.01)
*C23C 16/455* (2006.01)
(Continued)

(52) U.S. Cl.
CPC .... *C23C 16/45574* (2013.01); *C23C 16/4412* (2013.01); *C23C 16/45519* (2013.01);
(Continued)

(58) Field of Classification Search
CPC .............................................. C23C 16/45574
See application file for complete search history.

(56) References Cited

U.S. PATENT DOCUMENTS

2003/0226502 A1* 12/2003 Jang .................. C23C 16/45574
                                                                118/712
2009/0081374 A1   3/2009 Yang et al.
(Continued)

FOREIGN PATENT DOCUMENTS

EP          2436801 A1    4/2012
JP      H02-166735 A      6/1990
(Continued)

OTHER PUBLICATIONS

International Search Report of the corresponding International Application No. PCT/JP2014/054177, dated May 20, 2015.

*Primary Examiner* — Parviz Hassanzadeh
*Assistant Examiner* — Nathan K Ford
(74) *Attorney, Agent, or Firm* — Global IP Counselors, LLP

(57) ABSTRACT

A layer-forming device includes a feeding mechanism that feeds a substrate during layer formation, an injector unit having a plurality of injectors that supplies a layer-forming gas to the substrate, along a feeding passage of the substrate, and a reactant supply unit which generates a reactant. The injector unit supplies the reactant through gaps between the injectors to a layer of the layer-forming component. A substrate opposing surface of the injector includes a layer-forming gas supply slot through which the layer-forming gas is output, first gas exhaust slots that suck an excess gas such as the layer-forming gas, the first gas exhaust slots being provided on both sides of the layer-forming gas supply slot in a feeding direction of the substrate, and inert gas supply slots that supply an inert gas provided on far sides of the
(Continued)

respective first gas exhaust slots away from the layer-forming gas supply slot.

17 Claims, 7 Drawing Sheets

(51) Int. Cl.
  *H01J 37/32* (2006.01)
  *C23C 16/54* (2006.01)
(52) U.S. Cl.
  CPC .. *C23C 16/45536* (2013.01); *C23C 16/45544* (2013.01); *C23C 16/545* (2013.01); *H01J 37/3244* (2013.01); *H01J 37/32091* (2013.01); *H01J 37/32761* (2013.01); *H01J 2237/332* (2013.01)

(56) References Cited

U.S. PATENT DOCUMENTS

| | | | |
|---|---|---|---|
| 2009/0165715 A1* | 7/2009 | Oh | C23C 16/45551 118/723 R |
| 2009/0277586 A1 | 11/2009 | Hanada | |
| 2010/0206846 A1 | 8/2010 | Nishimura et al. | |
| 2011/0097491 A1 | 4/2011 | Levy et al. | |
| 2012/0237695 A1* | 9/2012 | Pye | C08J 7/08 427/554 |

FOREIGN PATENT DOCUMENTS

| | | |
|---|---|---|
| JP | 2005-105414 A | 4/2005 |
| JP | 2009-052063 A | 3/2009 |
| JP | 2010-192197 A | 9/2010 |
| JP | 2011-501779 A | 1/2011 |
| WO | 2012028782 A1 | 3/2012 |

* cited by examiner

LAYER-FORMING DEVICE AND INJECTOR

CROSS-REFERENCE TO RELATED APPLICATIONS

This U.S. National stage application claims priority under 35 U.S.C. § 119(a) to Japanese Patent Application No. 2013-039728, filed in Japan on Feb. 28, 2013, the entire contents of Japanese Patent Application No. 2013-039728 are hereby incorporated herein by reference.

BACKGROUND

Field of the Invention

The present invention relates to a layer-forming device that forms a thin layer on a substrate in atomic layer unit, and an injector that supplies a gas to the substrate.

Background Information

Today, an atomic layer deposition (ALD) technology is widely used when a thin layer is formed on a substrate. The ALD technology is to form a layer having a desired thickness by alternately supplying on the substrate two types of precursors containing, as a main component, an element that configures the thin layer to be formed, that is, by repeating formation of the thin layer on the substrate in atomic layer unit a plurality of times.

Among layer-forming devices using the ALD technology, spatial ALD is known, in which gases containing the two types of precursors are spatially separated and the film formation is performed. In the spatial ALD, an inert gas is caused to flow and function as a barrier gas that separates two types of gases so that the gases containing the two types of precursors are not mixed and reacted in a gas phase. Alternatively, the two types of gases are separated by suppression of mixture of the two types of gases by evacuation of the respective gases.

For example, in a layer-forming device using the ALD technology, a supply head in which a plurality of output channels is provided in a feeding direction of the substrate is used, the supply head alternately supplying a first reactive gas containing a first precursor and a second reactive gas containing a second precursor to a substrate being fed (JP 2011-501779 A). An output channel that injects an inert gas is provided between the output channel that supplies the first reactive gas to the substrate and the output channel that supplies the second reactive gas to the substrate (see FIGS. 5A and 5B of JP 2011-501779 A). This inert gas functions as the barrier gas.

SUMMARY

To improve a processing amount of layer formation per unit time in the layer-forming device, it is more advantageous as widths of the output channels along the feeding direction are made narrower and a larger number of output channels is provided, under a condition of a constant feeding speed of the substrate. However, in the above-described layer-forming device having a configuration in which one of the inert gas, the first reactive gas, the inert gas, and the second reactive gas is arranged for each output channel in sequence in the feeding direction of the substrate, improvement of the processing amount of layer formation per unit time is difficult. When the output channels having injection slots of the inert gas, the first reactive gas, the inert gas, and the second reactive gas in a narrow range are provided, the structure of the supply head becomes complicated, resulting in an increase in cost of the layer-forming device. Further, since the structure of the supply head is complicated, it becomes difficult to constantly keep injection amounts of respective gases, and reliability of the layer-forming device (uniformity of the thin layer) is easily decreased.

Therefore, an objective of the present invention is to provide a new injector and a new layer-forming device that can improve a processing amount of layer formation per unit time when supplying a gas to a substrate being fed.

In an aspect of the present disclosure, there is provided a layer-forming device that forms a thin layer on a substrate in atomic layer unit.

The layer-forming device includes:

a feeding mechanism configured to feed the substrate during layer formation of the substrate;

an injector unit including a plurality of injectors provided along a feeding passage of the substrate with gaps, and configured to supply a layer-forming gas toward the substrate to form, on the substrate being fed, a layer of a layer-forming component of the layer-forming gas; and a reactant supply unit configured to supply a reactant that reacts with the layer-forming component toward the substrate through the gaps, wherein a substrate opposing surface of each of the injectors, the surface facing the substrate, includes a layer-forming gas supply slot configured to output the layer-forming gas, first gas exhaust slots provided on both sides of the layer-forming gas supply slot in a feeding direction of the substrate, and configured to suck an excess gas above the substrate, and inert gas supply slots provided on far sides of the respective first gas exhaust slots away from the layer-forming gas supply slot, in the feeding direction, and configured to output an inert gas.

It is preferable that each of the injector includes tubular continuous holes respectively connected with the layer-forming gas supply slot, the first gas exhaust slots, and the inert gas supply slots, inside an injector member that configures each of the injectors, each of the continuous holes includes an opening in a surface of the injector member, and is connected with any one of a layer-forming gas supply pipe connected with a layer-forming gas source, an exhaust pipe connected with an exhaust device, and an inert gas supply pipe connected with an inert gas source, at the opening, and the tubular continuous holes respectively connected with the first gas exhaust slots and the inert gas supply slots include parts forming a ring shape inside the injector member.

When a vertical direction to the substrate opposing surface of the injector member is a height direction, the parts forming a ring shape of the continuous holes are preferably provided in different positions in the height direction of the injector member.

When a vertical direction to the substrate opposing surface of the injector member is a height direction, it is preferable that the injector member includes a plurality of member elements layered in the height direction, a continuous groove for forming each of the continuous holes is provided in each of the member elements, and each of the continuous holes is provided in a joined portion of the member elements in which the continuous grooves are provided.

Preferably, the substrate opposing surface further includes second gas exhaust slots configured to suck an excess gas above the substrate, and the second gas exhaust slots are provided on far sides of the respective inert gas feed slots away from the layer-forming gas feed slot, in the feeding direction.

Preferably, the layer-forming device further includes:

a layer-forming container in which the feeding mechanism, the injector unit, and a high-frequency electrode are arranged in an inner space, wherein the reactant includes radical atoms or radical molecules generated from plasma formed in the layer-forming container using the high-frequency electrode.

In another aspect of the present disclosure, there is provided an injector that supplies a layer-forming gas to be used in a layer-forming device to a substrate.

The injector includes, on a substrate opposing surface thereof, the surface facing the substrate;

a layer-forming gas supply slot of the layer-forming gas;

first gas exhaust slots provided on both sides of the layer-forming gas supply slot in a feeding direction of the substrate, and configured to suck an excess gas above the substrate; and inert gas supply slots provided on far sides of the respective first gas exhaust slots away from the layer-forming gas supply slot, in the feeding direction, and configured to supply an inert gas to a layer-forming component of the layer-forming gas.

It is preferable that the injector is configured from an injector member, and two continuous holes respectively connected with the first gas exhaust slots are provided inside the injector member, and the two continuous holes respectively extending from the first gas exhaust slots are merged inside the injector member.

Preferably, the injector is configured from an injector member, and tubular continuous holes respectively connected with the layer-forming gas supply slot, the first gas exhaust slots, and the inert gas supply slots are provided inside the injector member, each of the continuous holes includes an opening in a surface of the injector member, and is connected with any one of a layer-forming gas supply pipe connected with a layer-forming gas source, an exhaust pipe connected with an exhaust device, and an inert gas supply pipe connected with an inert gas source, at the opening, and tubular continuous holes respectively connected with the first gas exhaust slots and the inert gas feed slots include parts forming a ring shape inside the injector member.

When a vertical direction to the substrate opposing surface of the injector member is a height direction, the parts forming a ring shape of the continuous holes are preferably provided in different positions in the height direction from the substrate opposing surface of the injector member.

When a vertical direction to the substrate opposing surface of the injector member is a height direction, it is preferable that the injector member is configured from a plurality of member elements layered and joined in the height direction, a continuous groove for forming each of the continuous holes is provided in each of the member elements, and each of the continuous holes is formed in a joined portion of the member elements in which the continuous grooves are provided.

Preferably, the substrate opposing surface further includes second gas exhaust slots configured to suck an excess gas above the substrate, and the second gas exhaust slots are provided on far sides of the respective inert gas feed slots away from the layer-forming gas supply slot, in the feeding direction.

The injector and the layer-forming device described above can improve a processing amount of layer formation per unit time when supplying a gas to a substrate being fed.

DESCRIPTION OF EMBODIMENTS

Hereinafter, an injector and a layer-forming device of the present invention will be described in detail.

Figure 1:
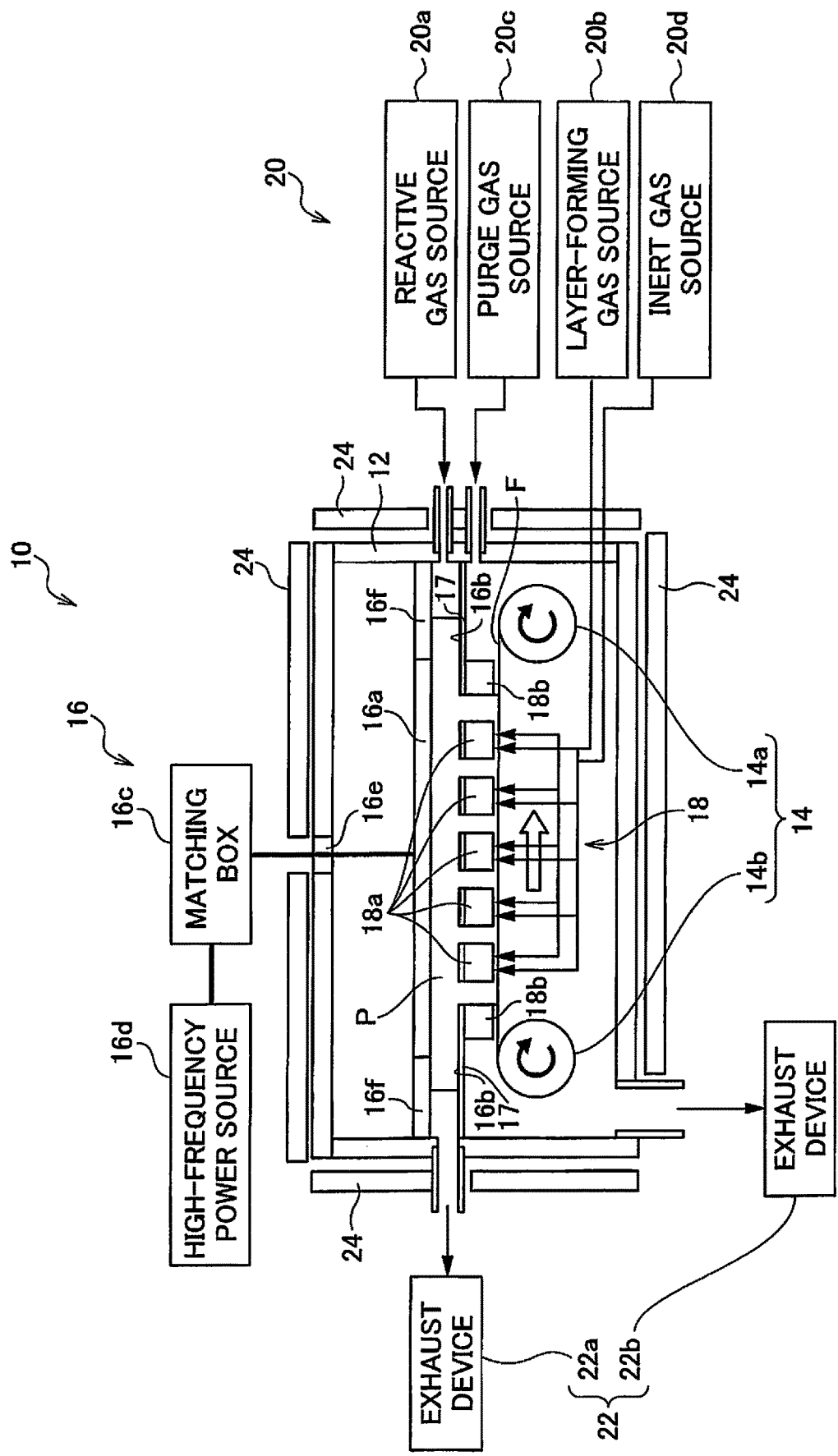
FIG. 1 is a schematic configuration diagram of a layer-forming device of the present embodiment.

FIG. 1 is a schematic configuration diagram of a layer-forming device of the present embodiment. A layer-forming device 10 includes a layer-forming container 12, a feeding mechanism 14, a plasma-generating unit 16, an injector unit 18, a gas supply unit 20, and an exhaust unit 22.

To be specific, the layer-forming device 10 is an ALD layer-forming device that forms a thin layer on a substrate in atomic layer unit.

The feeding mechanism 14 feeds the substrate during layer formation of the substrate.

The injector unit 18 includes an injector that injects a layer-forming gas toward the substrate to form a layer of a layer-forming component of the layer-forming gas on the substrate being fed. A plurality of injectors is provided with gaps along a feeding passage path of the substrate.

The plasma-generating unit 16 is a unit that generates a reactant that reacts with the layer-forming component, and is a reactant supply unit.

The reactant supply unit is configured to supply the reactant through each gap between adjacent injectors toward the substrate. A substrate opposing surface of each of the injectors, the substrate opposing surface facing the substrate, is provided with a layer-forming gas supply slot for outputting the layer-forming gas, first gas exhaust slots for sucking an excess gas on the substrate, and inert gas supply slots for outputting an inert gas. The first gas exhaust slots are provided on both sides of the layer-forming gas supply slot in a feeding direction of the substrate. Each inert gas supply slot is provided on a far side of each of the first gas exhaust slots away from the layer-forming gas supply splot, in the feeding direction.

Hereinafter, a configuration of the layer-forming device 10 will be described in detail. Note that, in the embodiment described below, a belt-shaped flexible substrate that is an extremely thin glass plate or resin film, and can be wound in a roll manner will be described as the layer-forming substrate. However, the layer-forming substrate used in the present invention is not limited to the belt-shaped flexible substrate. For example, one sheet of plate-shaped unflexible rigid substrate can be used as the layer-forming substrate.

As illustrated in FIG. 1, the feeding mechanism 14, a high-frequency electrode 16a belonging to the plasma-generating unit 16, and the injector unit 18 are mainly arranged inside a layer-forming space (inner space) of the layer-forming container 12. The layer-forming container 12 is a container that maintains predetermined pressure in the layer-forming space in the layer-forming container 12 or depressurizes the layer-forming space to maintain the pressure, and is used for layer-forming processing of the layer-forming substrate in the layer-forming space. Heaters 24 are respectively provided on outer peripheral wall surfaces of the layer-forming container 12 to control an atmosphere in the layer-forming space to have a temperature suitable for the layer-forming processing.

The layer-forming substrate fed by the feeding mechanism 14 is a belt-shaped flexible film F wound in a roll. The feeding mechanism 14 includes rotary rollers 14a and 14b. The rotary rollers 14a and 14b are connected with a drive motor (not illustrated), and are configured to be rotated with rotation of the drive motor. A rotating direction of the drive motor can be selected. The film F is wound around the rotary rollers 14a and 14b, and is formed in a rolled manner. The feeding mechanism 14 rotates the rotary rollers 14a and 14b, one of the rotary rollers 14a and 14b operating as a winding roller, and the other as a feeding roller, during layer forming. That is, the feeding mechanism 14 unwinds the film F from the roll wound around the rotary roller 14a or 14b, feeds the film F in one direction for layer formation, and then winds the film F subjected to the layer formation to make a roll of a film-formation processed film, by the rotation of the rotary rollers 14a and 14b. FIG. 1 illustrates a state in which the film F is fed from the rotary roller 14b to the rotary roller 14a, and is wound onto the rotary roller 14a.

In the present embodiment, to thicken the film thickness of the layer film formed on the film F, it is preferable to repeatedly perform the layer formation on the film F. At this time, it is preferable that the feeding mechanism 14 unwinds the film F from the roll of film-formation processed film again, which has been obtained by winding the film F subjected to the layer formation onto the rotary roller 14a, and feeds the film F from the rotary roller 14a toward the rotary roller 14b, that is, in a direction opposite to the feeding direction during the previous layer formation. During feeding, the film F is subjected to the layer formation and the layer thickness on the film increases. The rotary roller 14b winds the film F subjected to the layer formation to make a new roll of layer-formation processed film. Following that, to thicken the layer, the film F is fed from the rotary roller 14b toward the rotary roller 14a, that is, in a direction opposite to the feeding direction during the previous layer formation. During feeding, the film F is subjected to the layer formation and the layer thickness is increased. The rotary roller 14a winds the film F subjected to the layer formation to make a new roll of the layer-formation processed film. As described above, it is preferable to obtain a desired layer thickness of the thin layer formed on the film F by thickening the layer thickness of the thin layer while repeatedly feeding the film F in the different directions.

The exhaust unit 22 includes exhaust devices 22a and 22b such as rotary pumps or dry pumps. The exhaust unit 22 exhausts gases in the layer-forming space and a plasma-generating space where plasma is generated, in the layer-forming container 12, and maintains constant pressure. The exhaust device 22a exhausts a reactive gas in the plasma-generating space described below. The exhaust device 22b exhausts the gas in the layer-forming space including the plasma-generating space below the high-frequency electrode 16a.

The plasma-generating unit 16 includes the high-frequency electrode 16a, a grounding electrode 16b, a matching box 16c, and a high-frequency power source 16d. The plasma-generating unit 16 is a reactant-generating unit that generates a reactant that reacts with a layer-forming component of the layer-forming gas absorbed on the film F. The grounding electrode 16b is provided on a surface of a space-partitioning wall 17 traversing the layer-forming container 12. The high-frequency electrode 16a in the layer-forming container 12 is connected with the high-frequency power source 16d through a ceiling surface of the layer-forming container 12 via the matching box 16c with a feed line. The high-frequency power source 16d supplies a high-frequency voltage of 13.56 MHz to the high-frequency electrode 16a, for example. The high-frequency electrode 16a is a plate-shaped electrode. The grounding electrode 16b is provided below the high-frequency electrode 16a to face a plane surface of the high-frequency electrode 16a. By application of the high-frequency voltage to the high-frequency electrode 16a, plasma P is generated using the gas fed to a space between the high-frequency electrode 16a and the grounding electrode 16b, for example, an oxygen gas. That is, the space between the high-frequency electrode 16a and the grounding electrode 16b is the plasma-generating space.

The present embodiment uses a capacitively coupled plasma system in which the high-frequency electrode 16a and the grounding electrode 16b face each other and plasma is generated between the electrodes. However, other than the system, inductively coupled plasma or a known plasma-generating system can be used.

Note that the feed line that supply the high-frequency power to the high-frequency electrode 16a is connected with the matching box 16c outside the layer-forming container 12 through a hole provided in the ceiling surface of the layer-forming container 12. At this time, the hole is sealed with an insulator 16e. Further, an insulation plate 16f using a ceramic plate or the like is provided on an outer periphery of the high-frequency electrode 16a. With the insulation plate 16f, the plasma-generating space is separated from a space above the high-frequency electrode 16a.

The present embodiment employs the plasma-generating unit 16 that generates the reactant from the plasma, as a reactant-generating unit. However, the reactant-generating unit is not limited to the plasma-generating unit 16. For example, a reactant-generating unit that supplies ozone, $H_2O$, or ammonia to the film F as the reactant can be used. In this case, to enhance reaction activity of the reactant, it is preferable to set the temperature in the layer-forming space to 100° C. or more.

A through-hole is provided in a side wall (a side wall on the right side in FIG. 1) that forms the plasma-generating space, of the layer-forming container 12. The through-hole is connected with a gas supply pipe connected with a reactive gas source 20a described below, as illustrated in FIG. 1. The reactive gas is supplied into the plasma-generating space through the through-hole. Further, a through-hole is provided in a side wall (a side wall on the left side in FIG. 1) that forms the plasma-generating space, of the layer-forming container 12. The through-hole is connected with an exhaust pipe connected with an exhaust device 22a, as illustrated in FIG. 1.

The injector unit 18 is provided below the space-partitioning wall 17, between the plasma-generating unit 16 and the feeding passage of the film F, and above the feeding passage. The injector unit 18 includes the plurality of injectors 18a provided along the feeding passage of the film F with gaps. The plurality of injectors 18a forms a line along the feeding passage of the film F. Dummy injectors 18b are provided on both sides of the line of the plurality of injectors 18a. The injectors 18a supply the layer-forming gas to the film F being fed by outputting the layer-forming gas, and forms, on the film F, the layer of the layer-forming component of the layer-forming gas. The layer-forming component is chemisorbed by the film F. That is, a gas is selected as the layer-forming gas such that the layer-forming component is chemisorbed by the film F. The injectors 18a are arrayed mutually separated with gaps. Further, slit-like through-holes extending in a direction perpendicular to the feeding direction of the film F are provided in the space-partitioning wall 17 at positions corresponding to the gaps in the feeding direction of the film F. Accordingly, when the layer of the layer-forming component absorbed on the film F being fed passes by the immediately next gap between the injectors, radical atoms or radical molecules of the reactive gas obtained from the plasma P generated in the plasma-generating space described above are lowered and supplied toward the film F through the through-hole. That is, the layer-forming device 10 is configured such that the radical atoms or the radical molecules are supplied through the gaps between the injectors 18a to the layer of the layer-forming component formed on the film F. The dummy injectors 18b do not have a function to supply the layer-forming gas. The dummy injectors 18b are provided to form gaps with adjacent injectors 18a, the gaps being identical to the gap formed between adjacent two injectors 18a and 18a. Through the gaps, the radical atoms or the radical molecules are supplied to the film F.

The grounding electrode 16b is formed on upper surfaces of the injectors 18a and the dummy injectors 18b.

A through-hole is provided in a side wall (a side wall on the right side of FIG. 1) of the layer-forming container 12 below the space-partitioning wall 17. The through-hole is connected with a gas supply pipe connected with a purge gas source 20c described below. The purge gas is a gas used to efficiently exhaust unnecessary layer-forming gas, reactive gas, radical molecules, radical atoms, and the like.

Further, a gas supply pipe connected with a layer-forming gas source 20b and a gas supply pipe connected with an inert gas source 20d, which are described below, are connected with each of the injectors 18a.

Figure 2A:
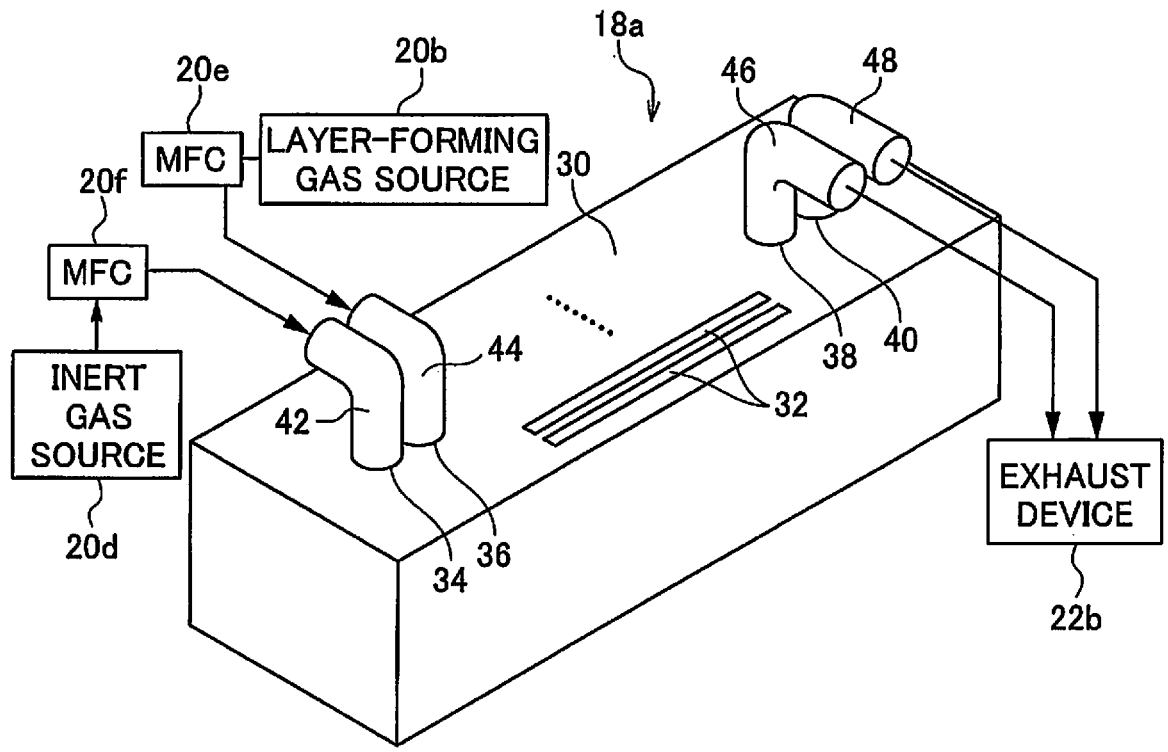
FIG. 2A is a schematic perspective view of an injector of the present embodiment.
Figure 2B:
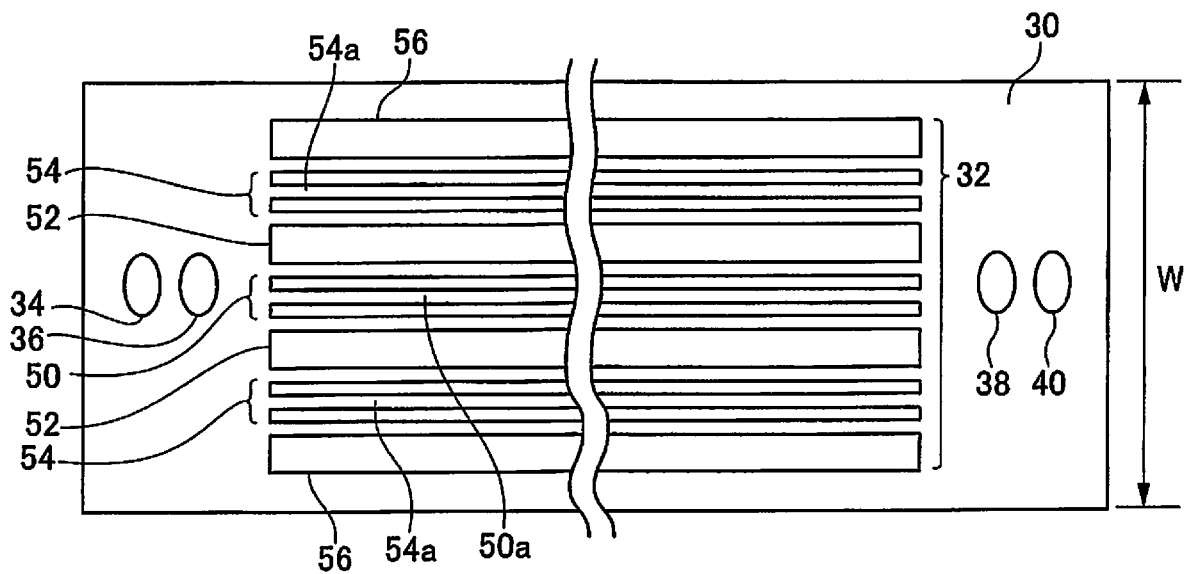
FIG. 2B is a diagram for describing a substrate opposing surface of the injector of the present embodiment.

The gas supply unit 20 includes the reactive gas source 20a, the layer-forming gas source 20b, the purge gas source 20c, the inert gas source 20d, and mass-flow controllers 20e and 20f (see FIGS. 2A and 2B).

As the reactive gas supplied by the reactive gas source 20a, $O_2$, $O_3$, $H_2O$, $N_2O$, $N_2$, $NH_3$ or the like is used. As the layer-forming gas supplied by the layer-forming gas source 20b, an organometallic compound gas containing trimethylaluminum (TMA), tetrakis (ethylmethylamino) zirconium, tetrakis (ethylmethylamino) hafnium, aminosilane, or the like is used. As the purge gas supplied by the purge gas source 20c, an inert gas such as a nitrogen gas, an argon gas, a neon gas, or a helium gas is used. As the inert gas supplied by the inert gas source 22d, an inert gas such as a nitrogen gas, an argon gas, a neon gas, or a helium gas is used. The inert gas is a gas that does not react with the reactive gas, the layer-forming gas, and the thin layer formed in the layer-forming device 10.

In such a layer-forming device 10, the plurality of injectors 18a are provided with gaps, and film F being fed receives the layer-forming gas supplied from the injectors 18a every time passing by each of the injectors 18a, and the layer-forming component of the layer-forming gas is chemisorbed on the film F in atomic layer unit.

Meanwhile, the reactive gas is supplied to the plasma-generating space during feeding of the film F, and the plasma P using the reactant gas is generated between the high-frequency electrode 16a to which the high-frequency voltage is applied and the grounding electrode 16b. The plasma P passes through the gaps between the injectors 18a and reaches the film F. At this time, ions are neutralized in a major part of the plasma, and the plasma is in a radical atom or radical molecule state. Therefore, the layer-forming component in atomic layer unit absorbed on the film F by supplying the layer-forming gas from the injectors 18a, and the radical molecules or the radical atoms react with each other, to form the thin layer. Since a plurality of gaps between adjacent injectors 18a and 18a are alternately provided, the thin layer formed on the film F gradually becomes thicker during feeding the film F.

In this way, the layer-forming device 10 can form the thin layer on the film F. The above is the description about the layer-forming device 10. Next, a configuration of the injector 18a will be described in detail.

(Detailed Description of Injector 18a)

FIG. 2A is a schematic perspective view of the injector 18a. FIG. 2A illustrates a substrate opposing surface 30 facing the film F, the substrate opposing surface facing upward. FIG. 2B is a diagram for describing the substrate opposing surface 30 of the injector 18a.

The substrate opposing surface 30 is provided with a plurality of slit-like openings 32, and gas supply ports 34 and 36 and gas exhaust ports 38 and 40 forming elliptical openings. The length of the openings 32 is similar to the width of the film F.

The gas supply port 34 is connected with an inert gas supply pipe 42. The inert gas supply pipe 42 is connected with the inert gas source 20d through the mass-flow controller 20f. The mass-flow controller 20f controls a supply amount of the inert gas to the layer-forming space.

The gas supply port 36 is connected with a layer-forming gas supply pipe 44. The layer-forming gas supply pipe 44 is connected with the layer-forming gas source 20b through the mass-flow controller 20e. The mass-flow controller 20e controls a feed amount of the layer-forming gas to the layer-forming space.

The gas exhaust ports 38 and 40 are respectively connected with exhaust pipes 46 and 48. The exhaust pipes 46 and 48 are connected with the exhaust device 22b.

In the present embodiment, the gas supply ports 34 and 36 and the gas exhaust ports 38 and 40 are provided in the substrate opposing surface 30 of the injector 18a. However, the configuration is not limited to the embodiment. The gas supply ports 34 and 36 and the gas exhaust ports 38 and 40 may be provided in another surface of the injector 18a.

The openings 32 provided in the substrate opposing surface 30 include, as illustrated in FIG. 2B, a layer-forming gas supply slot 50, first gas exhaust slots 52 and 52, inert gas supply slots 54 and 54, and second gas exhaust slots 56 and 56.

The layer-forming gas supply slot 50 is an opening through which the layer-forming gas is output. The first gas exhaust slots 52 and 52 are openings provided on both sides of the layer-forming gas supply slot 50 in the feeding direction of the film F, and suck an excess gas above the film F. The excess gas includes a gas that becomes an excess for a reaction on the film F. For example, the excess gas includes at least an excess layer-forming gas with the layer-forming component that is no longer absorbed because the layer of the layer-forming component has been formed on the film F by chemisorption, and a gas generated by the reaction on the film F. Further, the excess gas may include the inert gas and the purge gas described below. The inert gas supply slots 54 and 54 are provided on far sides of the respective first gas exhaust slots 52 and 52 away from the layer-forming gas supply slot 50, in the feeding direction of the film F, and output the inert gas.

Members 50a and 54a that block a part of the openings are provided on opening surfaces of the layer-forming gas supply slot 50 and the inert gas supply slots 54 and 54 along a longitudinal direction of the slit-like openings. The members 50a and 54a are provided to suppress injecting speeds of the layer-forming gas and the inert gas through the layer-forming gas supply slot 50, and the inert gas supply slots 54 and 54 as much as possible, and to gently supply the layer-forming gas and the inert gas to the surface of the film F. A width W of the injector 18a (see FIG. 2B) is 20 to 40 mm, for example, and opening widths of the layer-forming gas supply slot 50, the first gas exhaust slots 52 and 52, the inert gas supply slots 54 and 54, and the second gas exhaust slots 56 and 56 are 1 to 3 mm, for example.

Note that the second gas exhaust slots 56 and 56 are provided in the present embodiment. However, the second gas exhaust slots 56 and 56 may not necessarily be provided. However, it is preferable to provide the second gas exhaust slots 56 and 56 in terms of prevention of blockage of supply of the radical atoms and the radical molecules necessary for layer formation, to the film F, by reliably exhausting the inert gas and letting the inert gas flow into the gaps between the adjacent injectors 18a.

Figure 3B:
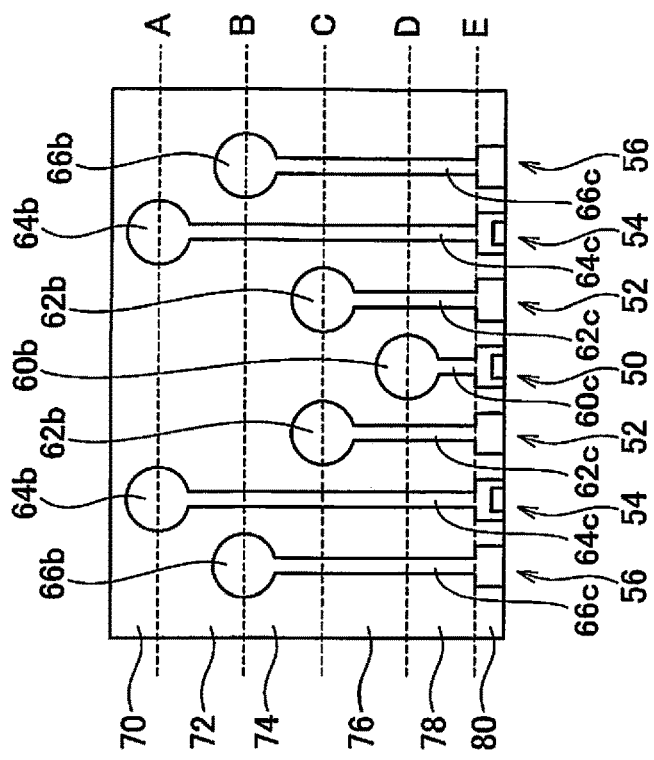
FIG. 3B is a cross-sectional view of the injector along the X-X' line in FIG. 3A.
Figure 3A:
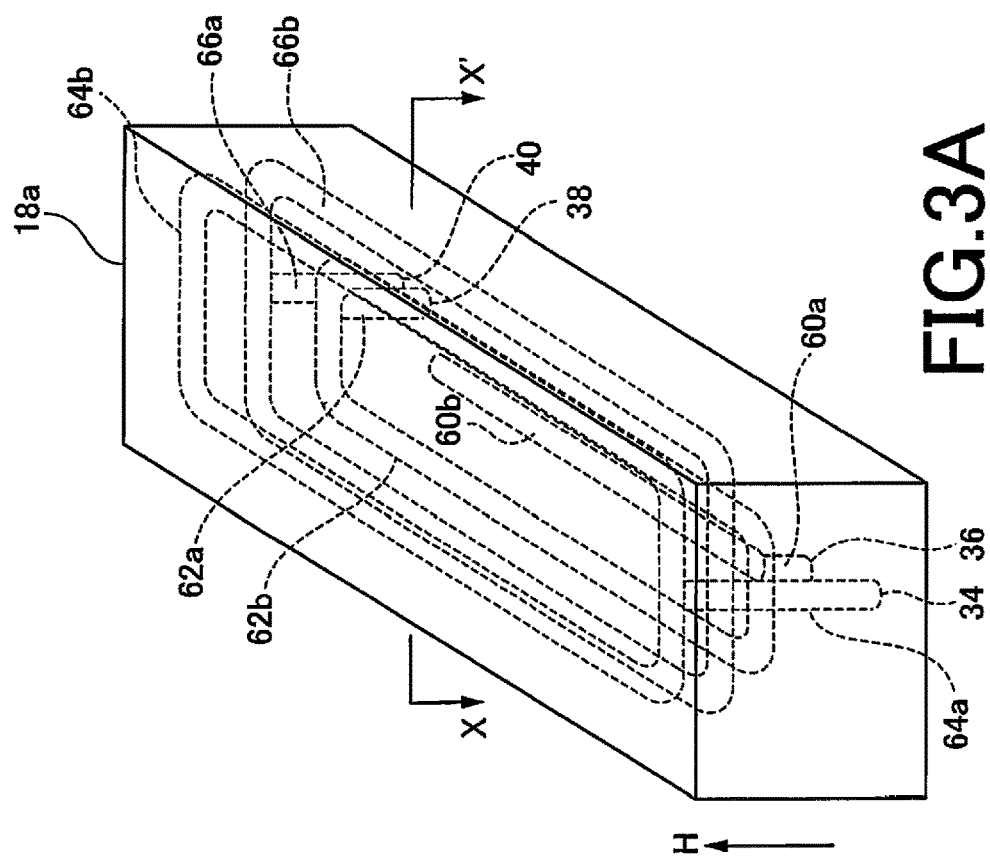
FIG. 3A is a diagram illustrating a gas flow passage of a layer-forming gas, a gas flow passage of an inert gas, and an exhaust passage, in the injector of the present embodiment.

FIG. 3A is a diagram three-dimensionally illustrating a gas flow passage of the layer-forming gas, a gas flow passage of the inert gas, and an exhaust passage, in the injector 18a, and FIG. 3B is a cross-sectional view of the injector 18a along the X-X' line in FIG. 3A. As illustrated in FIG. 3A, a tubular layer-forming continuous hole extending from the gas supply port 36 connected with the layer-forming gas supply pipe 44 is provided inside the injector 18a. The layer-forming gas continuous hole includes a upward part 60a rising along a height direction H of the injector 18a, an storage part 60b connected with the upward part 60a, and forming a long and narrow space extending in a width direction of the injector 18a inside the injector 18a, and a downward part 60c lowering along the height direction H from the storage part 60b to the layer-forming gas supply slot 50 (see FIG. 3B). The height direction H refers to a vertical direction to the substrate opposing surface 30 facing the film F, of the injector member of the injector 18a.

Further, an exhaust continuous hole extending from the exhaust port 38 connected with the exhaust pipe 46 is provided inside the injector 18a. The exhaust continuous hole includes a upward part 62a rising along the height direction H of the injector 18a, a ring part 62b (closed loop hole) connected with the upward part 62a, and forming a ring shape inside the injector 18a, and downward parts 62c lowering along the height direction H from the ring part 62b toward the two first gas exhaust slots 52 and 52 (see FIG. 3B). In other words, the two continuous holes extending from the two first gas exhaust slots 52 and 52 are merged inside an injector member, and reach the exhaust port 38.

Further, a tubular inert gas continuous hole extending from the gas supply port 34 connected with the inert gas feed pipe 42 is provided inside the injector 18a. The inert gas continuous hole includes a upward part 64a rising along the height direction H of the injector 18a, a ring part 64b (closed loop hole) connected with the upward portion 64a, and forming a ring shape at an upper portion inside the injector 18a, and downward parts 64c lowering along the height direction H from the ring part 64b toward the inert gas supply slots 54 and 54 (see FIG. 3B).

Further, an exhaust continuous hole extending from the exhaust port 40 connected with the exhaust pipe 48 is provided inside the injector 18a. The exhaust continuous hole includes a upward part 66a rising along the height direction H of the injector 18a, a ring part 66b (closed loop hole) connected with the upward part 66a, and forming a ring shape inside the injector 18a, and downward parts 66c lowering along the height direction H from the ring part 66b toward the second gas exhaust slots 56 and 56 (see FIG. 3B).

As illustrated in FIG. 3B, the ring parts 62b, 64b, and 66b, and the storage part 60b are provided in different positions in the height direction H.

As described above, the continuous holes of the injector 18a are connected with any one of the layer-forming gas supply pipe 44, the exhaust pipe 46 and 48, and the inert gas feed pipe 42 at the openings provided in the surface of the injector 18a. It is difficult to produce the plurality of continuous holes configured as described above by hollowing out an inside of one member. Therefore, as illustrated in FIG. 3B, it is preferable to have a configuration divided at positions of the ring parts and the storage part along division lines A to E. Hereinafter, member elements that configure the injector member of the injector 18a are referred to as member elements 70, 72, 74, 76, and 80 in order from the top.

Figure 4A:
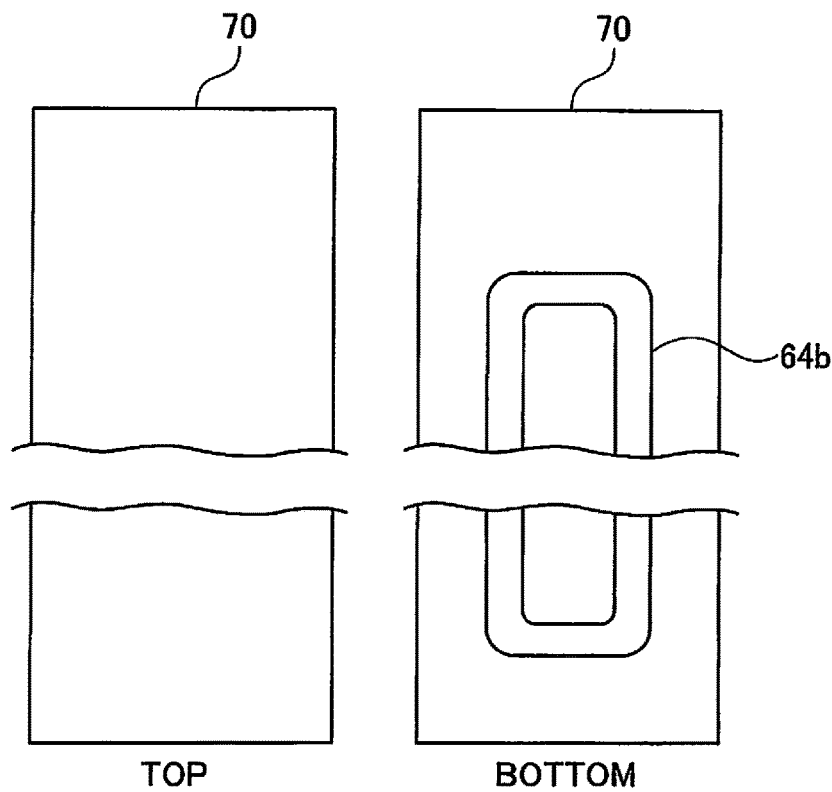
FIG. 4A is a top view and a bottom view of a member element of an uppermost sector of the injector of the present embodiment.
Figure 4B:
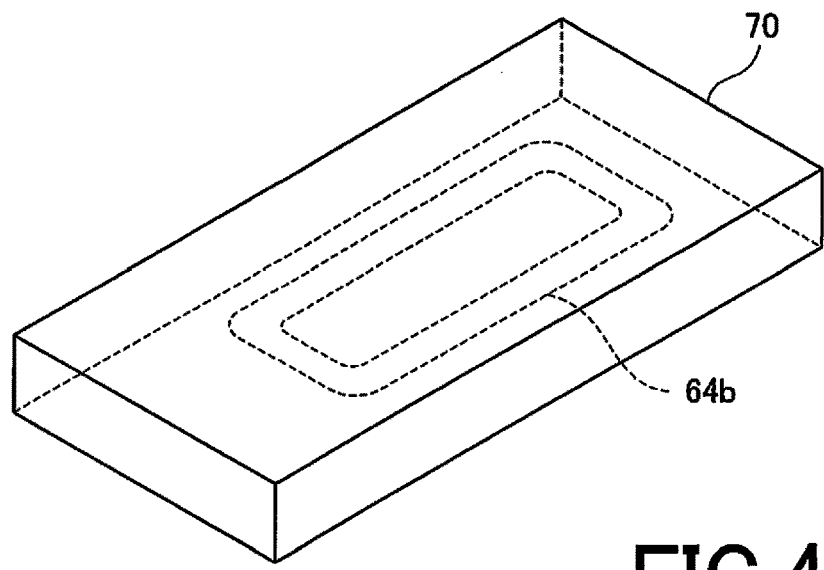
FIG. 4B is a perspective view of the member element of the uppermost sector of the injector of the present embodiment.
Figure 5A:
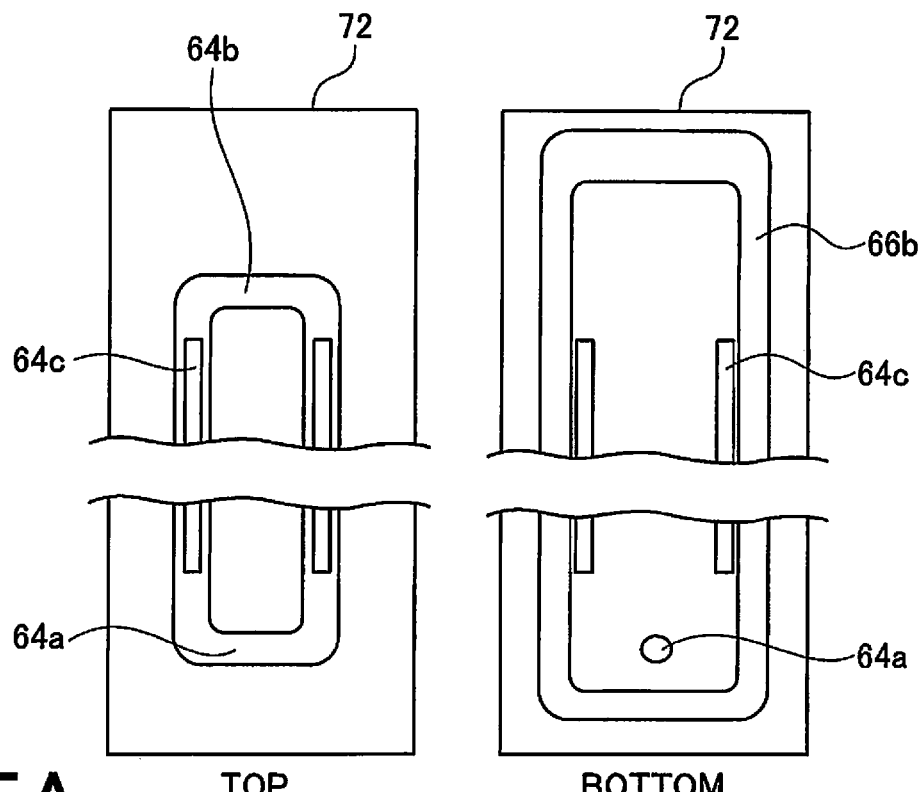
FIG. 5A is a top view and a bottom view of another member element of the injector of the present embodiment.
Figure 5B:
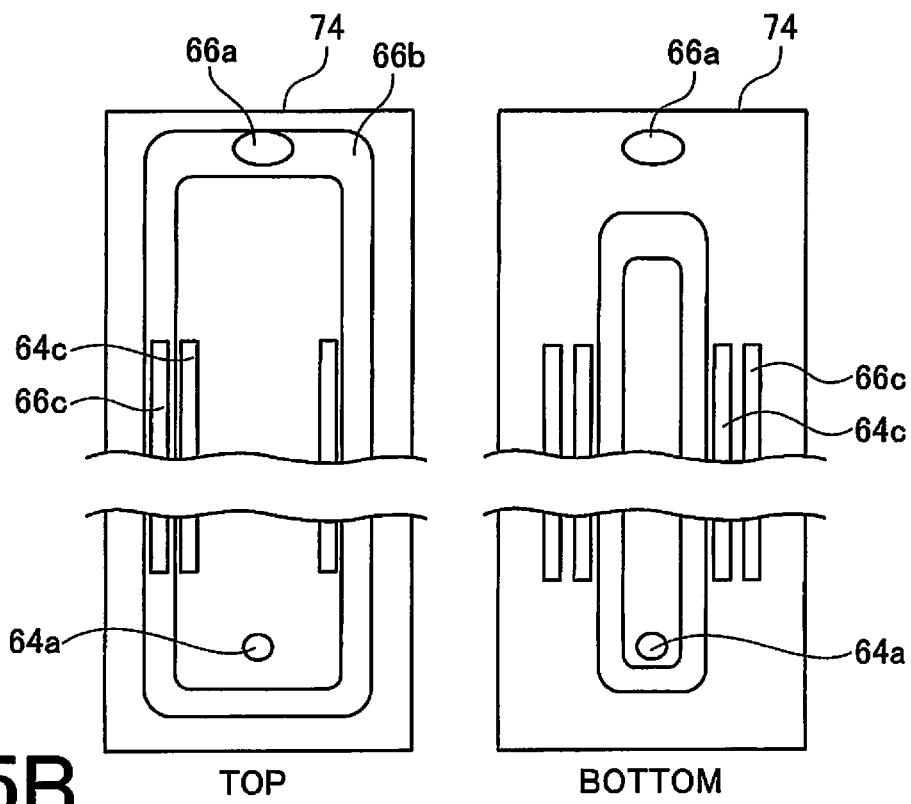
FIG. 5B is a top view and a bottom view of another member element of the injector of the present embodiment.
Figure 6A:
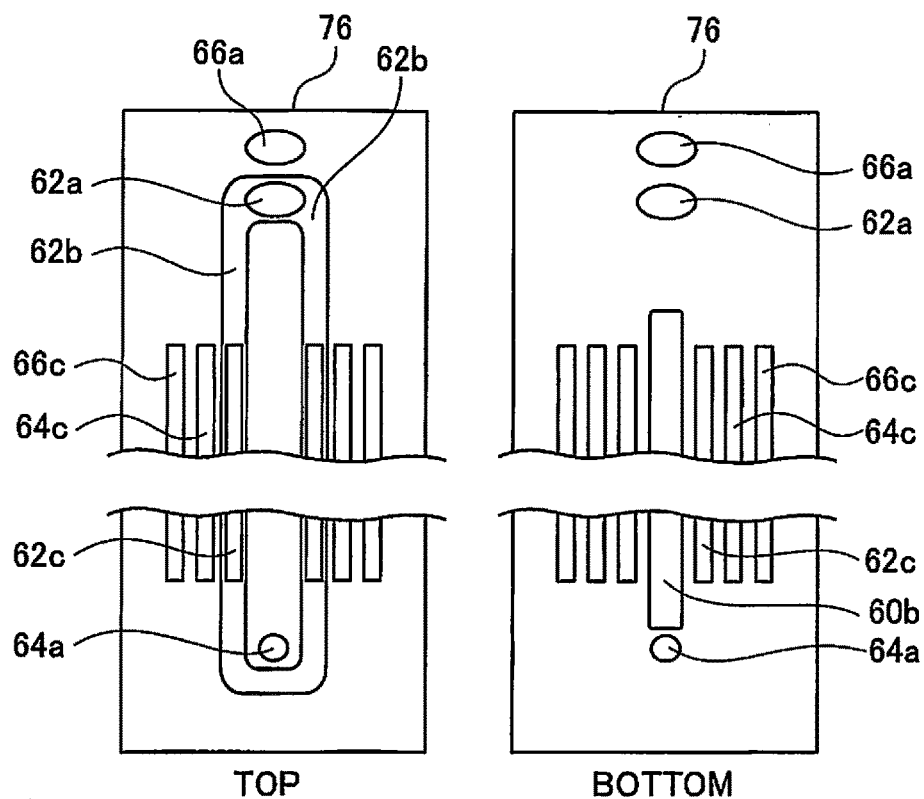
FIG. 6A is a top view and a bottom view of still another member element of the injector of the present embodiment.
Figure 6B:
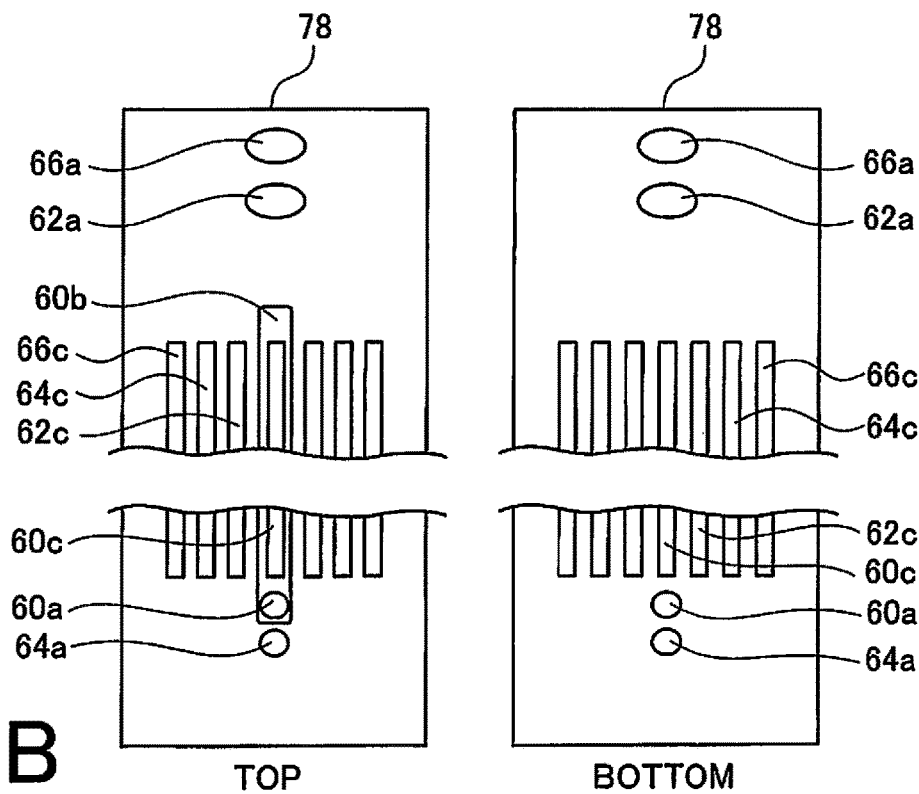
FIG. 6B is a top view and a bottom view of still another member element of the injector of the present embodiment.
Figure 7:
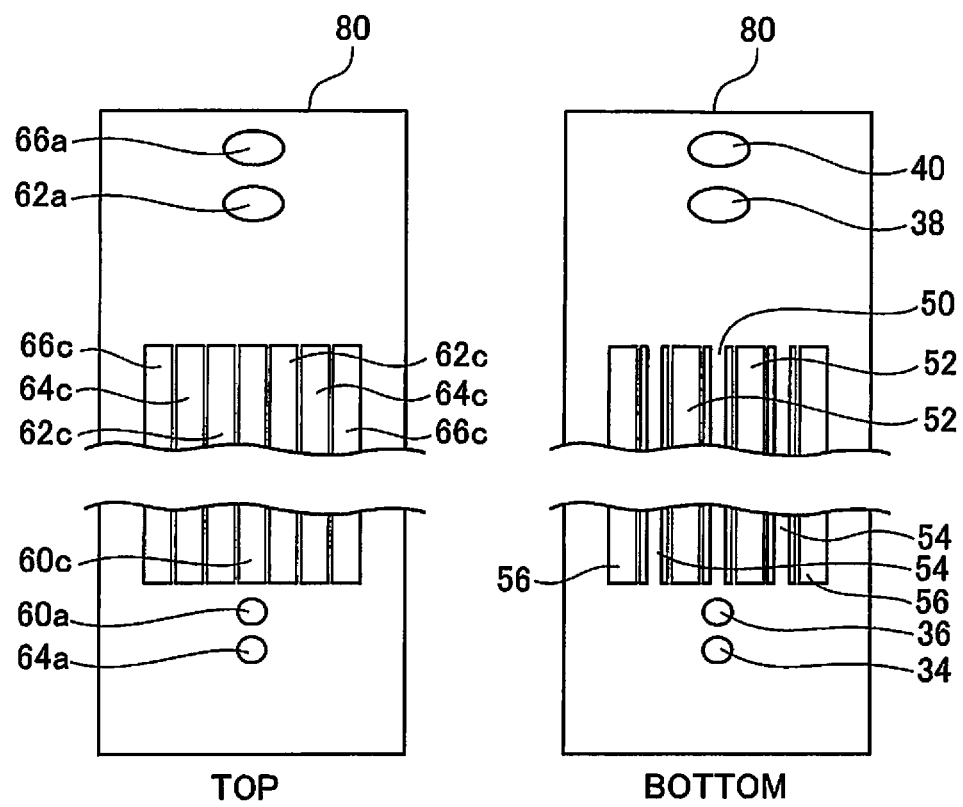
FIG. 7 is a top view and a bottom view of a member element of a lowermost sector of the injector of the present embodiment.

FIG. 4A illustrates a top view and a bottom view of the member element 70 of an uppermost layer, and FIG. 4B is a perspective view of the member element 70. FIG. 5A illustrates a top view and a bottom view of the second member element 72 from the uppermost layer. FIG. 5B illustrates a top view and a bottom view of the third member element 74 from the uppermost layer. FIG. 6A illustrates a top view and a bottom view of the fourth member element 76 from the uppermost layer. FIG. 6B illustrates a top view and a bottom view of the fifth member element 78 from the uppermost layer. FIG. 7 illustrates a top view and a bottom view of the member element 80 of a lowermost layer.

It is preferable to mutually join the member elements 70 to 80 by gluing with an adhesive or welding to configure the injector 18a. That is, it is preferable to form the member elements by combining continuous grooves by joining the member elements in which the continuous grooves are provided, and it is preferable to provide the continuous holes in joined portions of the member elements in which the continuous grooves are provided. In this case, gaskets are used to seal peripheries of the connection portions of the continuous grooves provided in the member elements 70 to 80, as needed.

Even the injector 18a in which the continuous holes are provided in a complicated manner as described above can be easily manufactured, because the continuous grooves can be dug for each member element from a surface of the member element to form the continuous groove.

The substrate opposing surface 30 of the injector 18a, the surface facing the film F, of the present embodiment includes the layer-forming gas supply slot 50 for the layer-forming gas, the first gas exhaust slots 52 and 52 that suck the excess layer-forming gas and are provided on both sides of the layer-forming gas supply slot 50 in the feeding direction of the film F, and the inert gas supply slots 54 and 54 that supply the inert gas to at least the layer-forming component and the reactive gas, and provided on the far sides of the respective first gas exhaust slots 52 and 52 away from the layer-forming gas supply slot 50, in the feeding direction of the film F. That is, the supply of the layer-forming gas, and the exhaust (suction) of the excess gas are completed in one injector 18a. Therefore, the width of the injector 18a (the length in the feeding direction of the film F) can be made short, and the processing amount per unit time of the layer formation can be improved under a condition of a constant feeding speed of the film F.

Since the inert gas supply slots 54 and 54 are provided on the far sides of the respective first gas exhaust slots 52 away from the layer-forming gas supply slot 50, the inert gas functions as a barrier gas that separates the layer-forming gas and the reactive gas, and prevents the radical atoms or the radical molecules of the reactive gas from being supplied through the gaps between the adjacent two injectors 18a and being mixed with and being reacted with the layer-forming gas. Further, the second gas exhaust slots 56 and 56 that suck the excess gas above the film F are provided on the far sides of the respective inert gas feed slots 54 and 54 away from the layer-forming gas feed slot 50, whereby the inert gas can be reliably collected through the second gas exhaust slots 56 and 56.

A part of the tubular continuous holes respectively connected with the first gas exhaust slots 52 and 52, and the inert gas supply slots 54 and 54 forms the ring shapes inside the member of the injector 18a. Therefore, the exhaust of the first gas exhaust slots 52 and 52 has uniform exhaust performance not depending on the positions of the openings in the length direction. Further, the supply amount of the inert gas through the inert gas supply slots 54 and 54 have uniform supply performance not depending on the positions of the openings in the length direction. Therefore, the layer-forming component of the layer-forming gas can be uniformly absorbed on the film F.

In the present embodiment, the ring parts respectively connected with the first gas exhaust slot 52 and the inert gas supply slot 54 and forming the ring shapes of the tubular continuous holes are provided in different positions in the height direction from the substrate opposing surface 30 of the member of the injector 18a. Therefore, the layer-forming gas supply slot 50, the first gas exhaust slots 52 and 52, and the inert gas supply slot 54 can be provided being close to each other. Therefore, the width of the injector 18a (the length in the feeding direction of the film) can be made narrow.

The member of the injector 18a is configured from the plurality of member elements 70 to 80 layered in the height direction H, and the continuous grooves for forming the continuous holes are provided in the member elements 70 to 80. Each of the continuous holes is formed by the continuous grooves of two member elements of the member elements 70 to 80 being combined. That is, each of the continuous holes is provided in the joined portion of the member elements 70 to 80 in which the continuous grooves are provided. Therefore, the continuous holes even in the complicated arrangement can be easily configured by providing the continuous grooves in the member elements 70 to 80. That is, the cost of the injector can be suppressed.

In the present embodiment, the second gas exhaust slots 56 and 56 that suck the excess inert gas on the film F are provided on the far sides of the respective inert gas supply slots 54 and 54, the far sides being away from the layer-forming gas supply slot 50, in the feeding direction of film F. Therefore, the inert gas can be reliably absorbed through the second gas exhaust slots 56 and 56.

The present embodiment employs the layer-forming container 12 in which the feeding mechanism 14, the injector unit 18, and the high-frequency electrode 16a are arranged in the inner space, and the reactant includes the radical atoms or the radical molecules generated from the plasma formed in the layer-forming container 12 using the high-frequency electrode 16a. Therefore, in the temperature of 100° C. or less of the layer-forming space, the reaction can be easily caused on the film F, and the layer formation can be efficiently performed.

As described above, the injector and the layer-forming device of the present invention have been described in detail. However, the injector and the layer-forming device of the present invention are not limited to the above-described embodiment, and various improvements and changes may be made without departing from the gist of the present invention.

The invention claimed is:

1. A layer-forming device that forms a thin layer on a substrate by atomic layer deposition, the layer-forming device comprising:
    a feeder configured to feed the substrate during layer formation of the substrate;
    an injector unit including a plurality of injectors provided along a feeding passage of the substrate with gaps that are disposed between adjacent injectors of the plurality of injectors, and configured to supply a layer-forming gas toward the substrate to form, on the substrate being fed, a layer of a layer-forming component of the layer-forming gas; and
    a reactant supplier configured to supply a reactant that reacts with the layer-forming component toward the substrate through the gaps,
    each injector including a substrate opposing planar surface, the planar surface facing the substrate, and including a layer-forming gas supply slot configured to output the layer-forming gas, first gas exhaust slots provided on both sides of the layer-forming gas supply slot in a feeding direction of the substrate, and configured to suck an excess gas above the substrate, and inert gas supply slots provided on far sides of the respective first gas exhaust slots away from the layer-forming gas supply slot, in the feeding direction, and configured to output an inert gas,
    each injector of the plurality of injectors including continuous holes that include a first continuous hole, a second continuous hole, and a third continuous hole respectively connected with the layer-forming gas supply slot, the first gas exhaust slots, and the inert gas supply slots, through down holes inside each injector, the down holes being included as portions of the continuous holes in each injector,
    each of the first, second, and third continuous holes including an opening in the substrate opposing planar surface, the first continuous hole connected with the layer-forming gas supply slot being connected, at the opening, with a layer-forming gas supply pipe that is connected with a layer-forming gas source, the second continuous hole that is connected to the first gas exhaust slots being connected, at the opening, with an exhaust pipe that is connected with a pump, the third continuous hole connected to the inert gas supply slots being connected, at the opening, with an inert gas supply pipe that is connected with an inert gas source, and the second and third continuous holes respectively connected with the first gas exhaust slots and the inert gas supply slots including closed loop holes inside each injector, each closed loop hole having a closed loop shape formed on a plane that is perpendicular to an extending direction of the down holes, and being connected, at different circumferential positions in each closed loop hole, with the down holes extending to the first gas exhaust slots or the inert gas supply slots, respectively.

2. The layer-forming device according to claim 1, wherein, when a vertical direction to the substrate opposing planar surface is a height direction, the closed loop holes of the continuous holes are provided in different positions in the height direction.

3. The layer-forming device according to claim 2, wherein each injector includes a plurality of member elements layered in the height direction, a continuous groove for forming each of the closed loop holes is provided in each of the member elements, and each of the closed loop holes is provided in a joined portion of the member elements in which the continuous grooves are provided.

4. The layer-forming device according to claim 2, wherein the substrate opposing planar surface further includes second gas exhaust slots configured to suck an excess gas above the substrate, and the second gas exhaust slots are provided on far sides of the respective inert gas supply slots away from the layer-forming gas supply slot, in the feeding direction.

5. The layer-forming device according to claim 2, further comprising:

a layer-forming container in which the feeder, the injector unit, and a high-frequency electrode are arranged in an inner space, wherein the reactant includes radical atoms or radical molecules generated from plasma formed in the layer-forming container using the high-frequency electrode.

6. The layer-forming device according to claim 1, wherein, when a vertical direction to the substrate opposing planar surface is a height direction, each injector includes a plurality of member elements layered in the height direction, a continuous groove for forming each of the closed loop holes is provided in each of the member elements, and each of the closed loop holes is provided in a joined portion of the member elements in which the continuous grooves are provided.

7. The layer-forming device according to claim 6, wherein the substrate opposing planar surface further includes second gas exhaust slots configured to suck an excess gas above the substrate, and the second gas exhaust slots are provided on far sides of the respective inert gas supply slots away from the layer-forming gas supply slot, in the feeding direction.

8. The layer-forming device according to claim 6, further comprising:

a layer-forming container in which the feeder, the injector unit, and a high-frequency electrode are arranged in an inner space, wherein the reactant includes radical atoms or radical molecules generated from plasma formed in the layer-forming container using the high-frequency electrode.

9. The layer-forming device according to claim 1, wherein the substrate opposing planar surface further includes second gas exhaust slots configured to suck an excess gas above the substrate, and the second gas exhaust slots are provided on far sides of the respective inert gas supply slots away from the layer-forming gas supply slot, in the feeding direction.

10. The layer-forming device according to claim 9, further comprising:

a layer-forming container in which the feeder, the injector unit, and a high-frequency electrode are arranged in an inner space, wherein the reactant includes radical atoms or radical molecules generated from plasma formed in the layer-forming container using the high-frequency electrode.

11. The layer-forming device according to claim 1, further comprising:

a layer-forming container in which the feeder, the injector unit, and a high-frequency electrode are arranged in an inner space, wherein the reactant includes radical atoms or radical molecules generated from plasma formed in the layer-forming container using the high-frequency electrode.

12. The layer-forming device according to claim 1, wherein an elongated portion of the substrate opposing surface is provided on one of the inert gas supply slots that is connected with one of the down holes extending from one of the closed loop holes that is connected with the inert gas supply pipe, the elongated portion extending along a lateral direction perpendicular to the feeding direction between both ends of the one of the inert gas supply slots in the lateral direction such that the elongated portion divides the one of the inert gas supply slots into two opening sections in the feeding direction.

13. An injector that supplies a layer-forming gas to be used in a layer-forming device to a substrate, the injector comprising:

a layer-forming gas supply slot;

first gas exhaust slots provided on both sides of the layer-forming gas supply slot in a feeding direction of the substrate, and configured to suck an excess gas above the substrate;

inert gas supply slots provided on far sides of the respective first gas exhaust slots away from the layer-forming gas supply slot, in the feeding direction, and configured to supply an inert gas to a layer-forming component of the layer-forming gas, the layer-forming gas supply slot, the first gas exhaust slots, and the inert gas supply slots being provided on a substrate opposing planar surface of the injector; and first, second and third continuous holes disposed inside the injector, the first, second and third continuous holes respectively connected with the layer-forming gas supply slot, the first gas exhaust slots, and the inert gas supply slots through down holes that are included as portions of the continuous holes, each of the continuous holes including an opening in the substrate opposing planar surface of the injector, the first continuous hole that is connected with the layer-forming gas supply slot being connected, at the opening, with a layer-forming gas supply pipe that is connected with a layer-forming gas source, the second continuous hole that is connected with the first gas exhaust slots being connected, at the opening, with an exhaust pipe that is connected with a pump, the third continuous hole that is connected with the inert gas supply slots being connected, at the opening, with an inert gas supply pipe that is connected with an inert gas source, and the second and third continuous holes respectively connected with the first gas exhaust slots and the inert gas supply slots including closed loop holes inside the injector, each closed loop hole having a closed loop shape formed on a plane that is perpendicular to an extending direction of the down holes, and being connected, at different circumferential positions in each closed loop hole, with the down holes extending to the first gas exhaust slots or the inert gas supply slots, respectively.

14. The injector according to claim 13, wherein, when a vertical direction to the substrate opposing planar surface is a height direction, the closed loop holes are provided in different positions in the height direction.

15. The injector according to claim 13, wherein, when a vertical direction to the substrate opposing planar surface of the injector is a height direction, the injector is configured from a plurality of member elements layered and joined in the height direction, a continuous groove for forming each of the closed loop holes is provided in each of the member elements, and each of the closed loop holes is formed in a joined portion of the member elements in which the continuous grooves are provided.

16. The injector according to claim 13, wherein the substrate opposing planar surface further includes second gas exhaust slots configured to suck an excess gas above the substrate, and the second gas exhaust slots are provided on far sides of the respective inert gas supply slots away from the layer-forming gas supply slot, in the feeding direction.

17. The injector according to claim 13, wherein an elongated portion of the substrate opposing surface is provided on one of the inert gas supply slots that is connected with one of the down holes extending from one of the closed loop holes that is connected with the inert gas supply pipe, the elongated portion extending along a lateral direction perpendicular to the feeding direction between both ends of the one of the inert gas supply slots in the lateral direction such that the elongated portion divides the one of the inert gas supply slots into two opening sections in the feeding direction.

* * * * *